(12) United States Patent
Dadvand et al.

(10) Patent No.: US 10,607,931 B2
(45) Date of Patent: Mar. 31, 2020

(54) SEMICONDUCTOR DEVICE WITH ELECTROPLATED DIE ATTACH

(71) Applicant: Texas Instruments Incorporated, Dallas, TX (US)

(72) Inventors: Nazila Dadvand, Richardson, TX (US); Christopher Daniel Manack, Flower Mound, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/026,371

(22) Filed: Jul. 3, 2018

(65) Prior Publication Data

US 2020/0013709 A1    Jan. 9, 2020

(51) Int. Cl.
| | |
|---|---|
| *H01L 23/48* | (2006.01) |
| *H01L 23/498* | (2006.01) |
| *H01L 23/00* | (2006.01) |
| *H01L 23/532* | (2006.01) |

(52) U.S. Cl.
CPC .. *H01L 23/49838* (2013.01); *H01L 23/53233* (2013.01); *H01L 24/09* (2013.01); *H01L 24/49* (2013.01); *H01L 24/85* (2013.01)

(58) Field of Classification Search
CPC .......... H01L 23/49838; H01L 23/4985; H01L 23/53233; H01L 24/09; H01L 24/16; H01L 24/49; H01L 24/81; H01L 24/85

USPC .................. 257/668, 696, 737; 438/107, 125
See application file for complete search history.

(56) References Cited

U.S. PATENT DOCUMENTS

| | | | |
|---|---|---|---|
| 6,277,672 B1 | 8/2001 | Ho | |
| 6,331,447 B1 | 12/2001 | Ho et al. | |
| 6,753,600 B1 | 6/2004 | Ho | |
| 9,276,140 B1* | 3/2016 | Tam | .................. H01L 31/02002 |
| 2002/0149092 A1 | 10/2002 | Lee | |
| 2011/0227233 A1 | 9/2011 | Wainerdi et al. | |
| 2012/0199960 A1* | 8/2012 | Cosue | ..................... H01L 24/85 |
| | | | 257/668 |
| 2013/0313726 A1 | 11/2013 | Uehling | |
| 2017/0178998 A1 | 6/2017 | Jeun et al. | |

\* cited by examiner

*Primary Examiner* — Brook Kebede
(74) *Attorney, Agent, or Firm* — Ronald O. Neerings; Charles A. Brill; Frank D. Cimino

(57) ABSTRACT

A packaged semiconductor device includes a metal substrate having a center aperture with a plurality of raised traces around the center aperture including a metal layer on a dielectric base layer. A semiconductor die that has a back side metal (BSM) layer is mounted top side up in a top portion of the center aperture. A single metal layer directly between the BSM layer and walls of the metal substrate bounding the center aperture to provide a die attachment that fills a bottom portion of the center aperture. Leads having at least one bend that contact the metal layer are on the plurality of traces and include a distal portion that extends beyond the metal substrate. Bond wires are between the traces and bond pads on the semiconductor die. A mold compound provides encapsulation.

18 Claims, 7 Drawing Sheets

SEMICONDUCTOR DEVICE WITH ELECTROPLATED DIE ATTACH

FIELD

This Disclosure relates to semiconductor device assembly, more specifically to die attachment to a substrate.

BACKGROUND

Packaged semiconductor devices generally comprise an integrated circuit (IC) die which is conventionally a silicon die that is mounted on a die pad of a workpiece such as a lead frame using a die attach adhesive. Other workpieces include an interposer, printed circuit board (PCB), and another IC die. For IC die assembled top (active) side up and back side down, the die attach adhesive provides a mechanical attachment, and generally also provides an electrical and/or thermal pathway to the die pad. The die attach adhesive generally comprises a polymer such as a polyimide or an epoxy-based adhesive. Silver is often added in particle flake form as a filler to raise both the electrical conductivity and the thermal conductivity of the polymer material.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize conventional die attach solutions comprising metal particle filled polymers have significant thermal and electrical resistance. Since thermal management is becoming more important with the trend for more compact and more highly integrated electronic systems having smaller features and running at higher operating currents, higher thermal conductivity die attach arrangements are needed that also provide a low electrical resistance when back side electrical contact is used. It is recognized that although solder die attach, such as eutectic gold and tin (AuSn), can provide back side electrical contact with relatively good thermal and electrical resistance as compared to metal filled polymers, solder die attach is relatively expensive, is limited to solderable die surfaces, and the solder die attach process involves an inert reflow at temperatures that can cause temperature induced stresses to the semiconductor die's metal interconnect.

Disclosed packaged semiconductor devices include a metal substrate having a center aperture including an outer ring with a plurality of raised traces around the center aperture including a metal layer on a dielectric base layer. A semiconductor die having a back side metal (BSM) layer is mounted top side up on a top portion of the center aperture. A single metal layer is directly between the BSM layer and substrate walls bounding the center aperture to provide a die attachment that fills a bottom portion of the aperture. Leads having at least one bend that contact the metal layer are on the plurality of traces and include a distal portion that extends beyond the metal substrate. Bond wires are between the traces and bond pads on the semiconductor die. A mold compound provides encapsulation.

BRIEF DESCRIPTION OF THE DRAWINGS

Reference will now be made to the accompanying drawings, which are not necessarily drawn to scale, wherein.

DETAILED DESCRIPTION

Figure 1A:
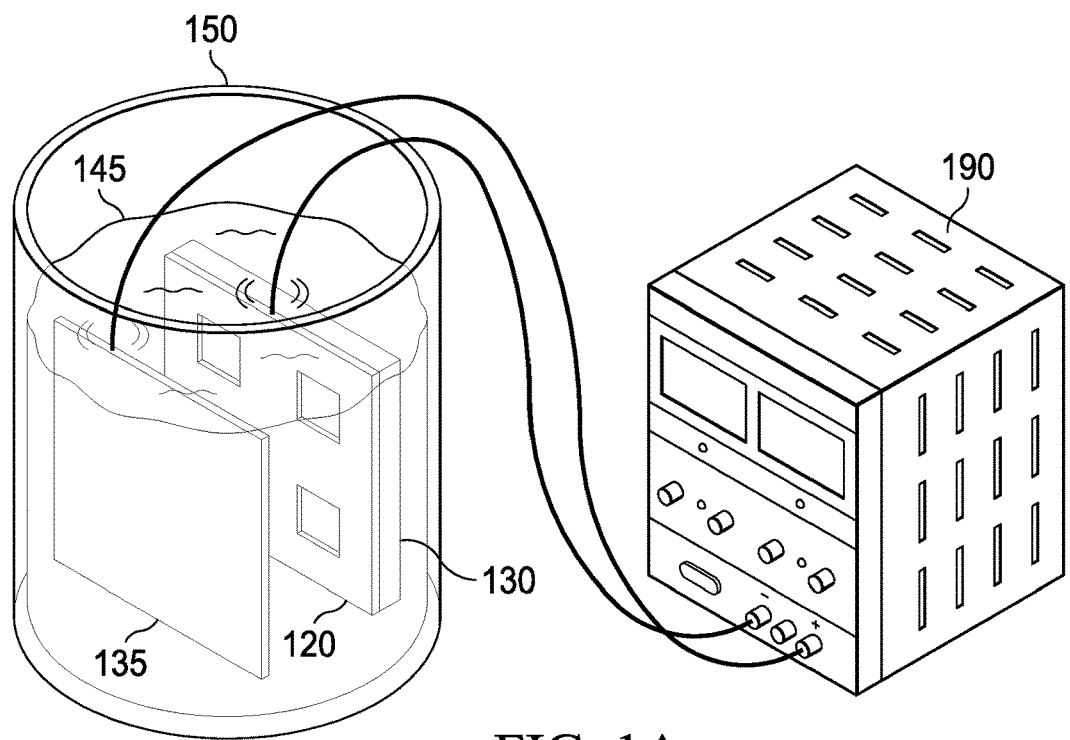
FIGS. 1A-J show components utilized and assembly process progression process for an assembly process for forming a disclosed packaged semiconductor device having a semiconductor die with a BSM layer directly attached onto a metal substrate by an electroplated metal die attach layer, according to an example aspect.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

FIGS. 1A-I shown components utilized and assembly process progression for forming a disclosed packaged semiconductor device having a back side metal plated semiconductor die directly attached onto a metal substrate by an electroplated metal die attach layer, according to an example aspect. FIG. 1A shows immersing a disclosed stack comprising a dielectric cover 130 on a metal substrate 120 having die therein within a plating container 150 that provides an electroplating bath. These components are immersed in a solution called an electrolyte containing one or more dissolved metal salts as well as other ions that permit the flow of electricity.

The cover 130 comprises a dielectric (e.g., plastic) material that covers the top of the metal substrate 120. The metal substrate 120 is in the form of a substrate sheet/panel having a plurality of die positions with 4 shown by example with die (not shown) in the rectangular die positions positioned top side up within apertures in the metal substrate 120. The substrate sheet/panel may have about 50 to 1,000 die positions. There is a plating solution 145 in the plating container 150. There is also a sealant, such as electroplating solution resistant tape between the dielectric cover 130 and the metal substrate 120 to avoid plating metal on the top side of the semiconductor die. For electroplating, the metal substrate 120 is connected to a negative terminal (cathode) of a power supply 190, and an electrically conductive structure spaced aperture from the metal substrate 120 such as a metal block shown as an anode 135 in FIG. 1A spaced apart from the metal substrate 120 is connected to a positive terminal (anode) of the power supply 190. The electroplating is generally performed at a temperature from 15° C. to 30° C. to avoid introduction of temperature induced stresses, such as to the semiconductor die interconnect. At the cathode, the dissolved metal ions (e.g., $Cu^{+2}$) in the electrolyte solution are reduced at the interface between the solution and the cathode, such that they plate out to a zero valence state metal (e.g., Cu metal) onto the cathode. The electroplating is generally performed using direct current (DC), but can also be performed as pulsed electroplating.

Figure 1B:
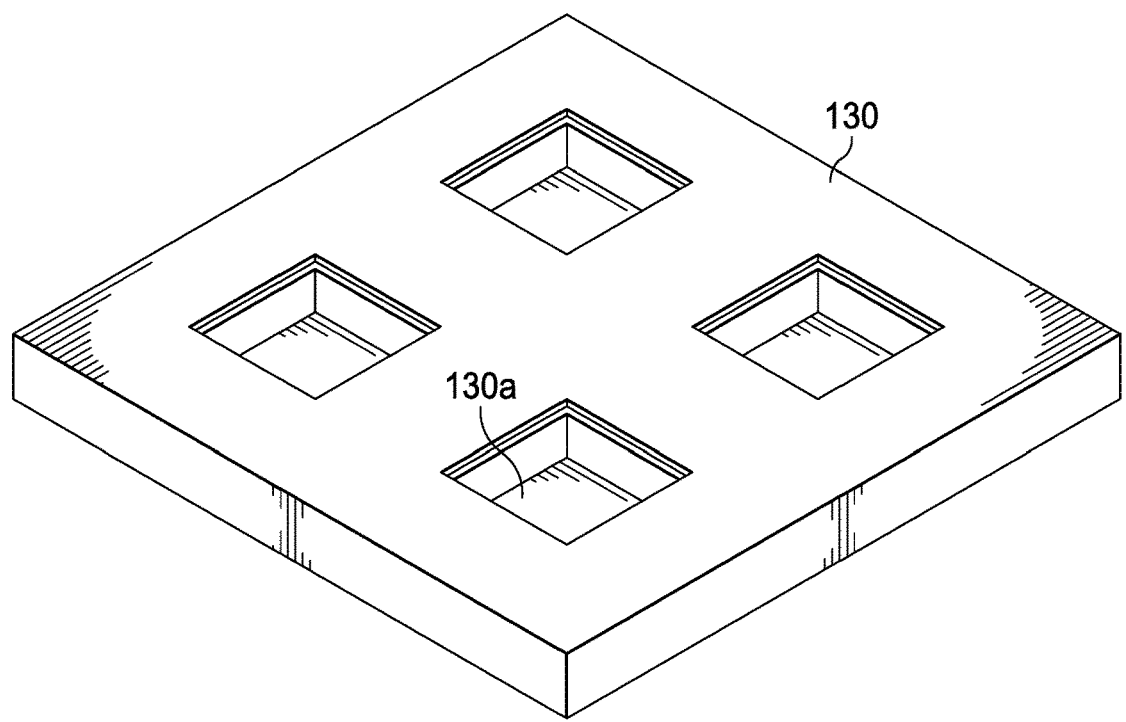

FIG. 1B shows an example dielectric cover 130. The dielectric cover 130 can comprise a plastic. The dielectric cover 130 has a first repeating pattern of recesses 130a shown as being rectangular shaped that are sized and shaped to match semiconductor die to be covered, being slightly larger in area as compared to the semiconductor die to enable receiving the semiconductor die.

Figure 1C:
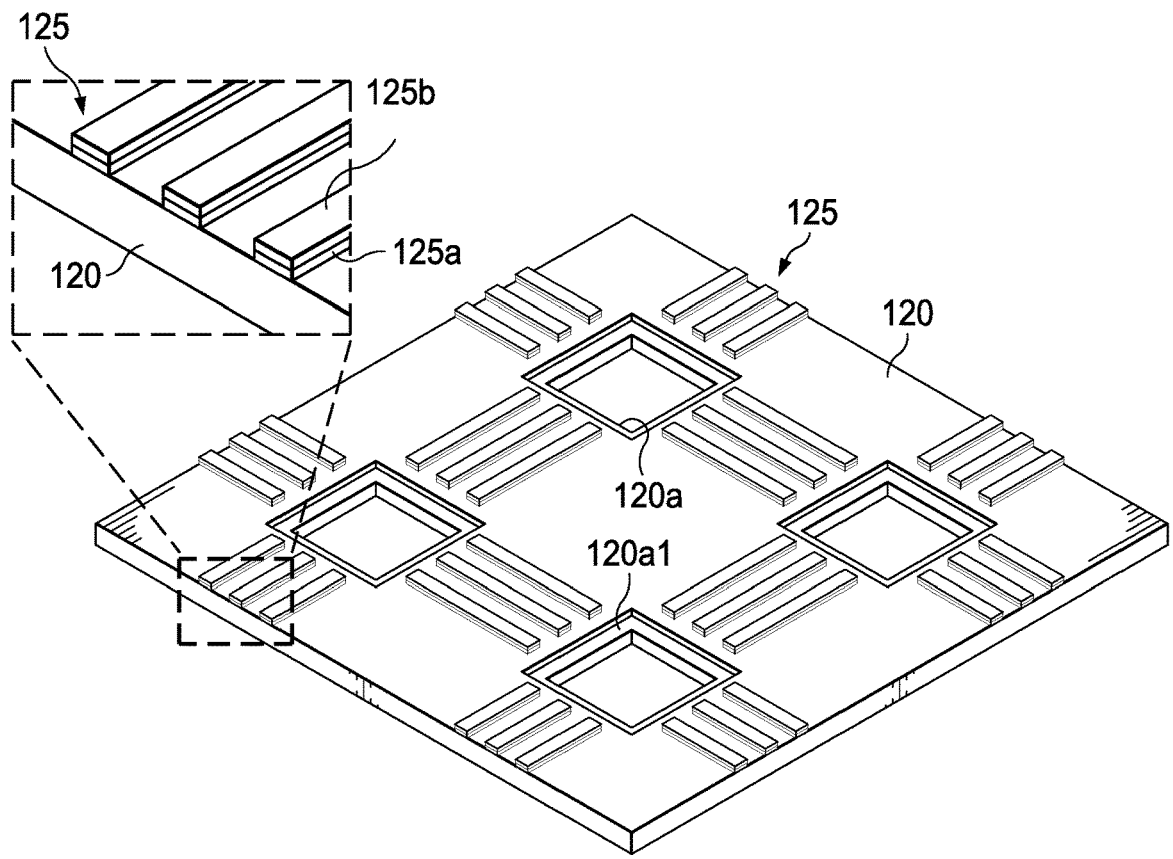

FIG. 1C shows an example metal substrate 120 with an inset expanding a portion thereof to show respective components of the raised traces 125 on the metal substrate 120. The metal substrate 120 can comprise copper, such as a copper alloy. Other example metals include Ni, Co, Sn, or their alloys. The metal substrate 120 includes a second repeating pattern having positions matching the first repeating pattern on the dielectric cover 130 shown in FIG. 1B including center through-hole apertures 120a that position match the recesses 130a. The through-hole apertures 120a have an outer ring 120a1 for the die to sit on and a plurality of raised traces 125 around the through-hole apertures 120a, where the raised traces 125 comprise a metal layer 125b on a dielectric base layer 125a (e.g., a polyimide) on the metal substrate 120. The metal layer 125b may be printed on the dielectric base layer 125a.

Figure 1D:
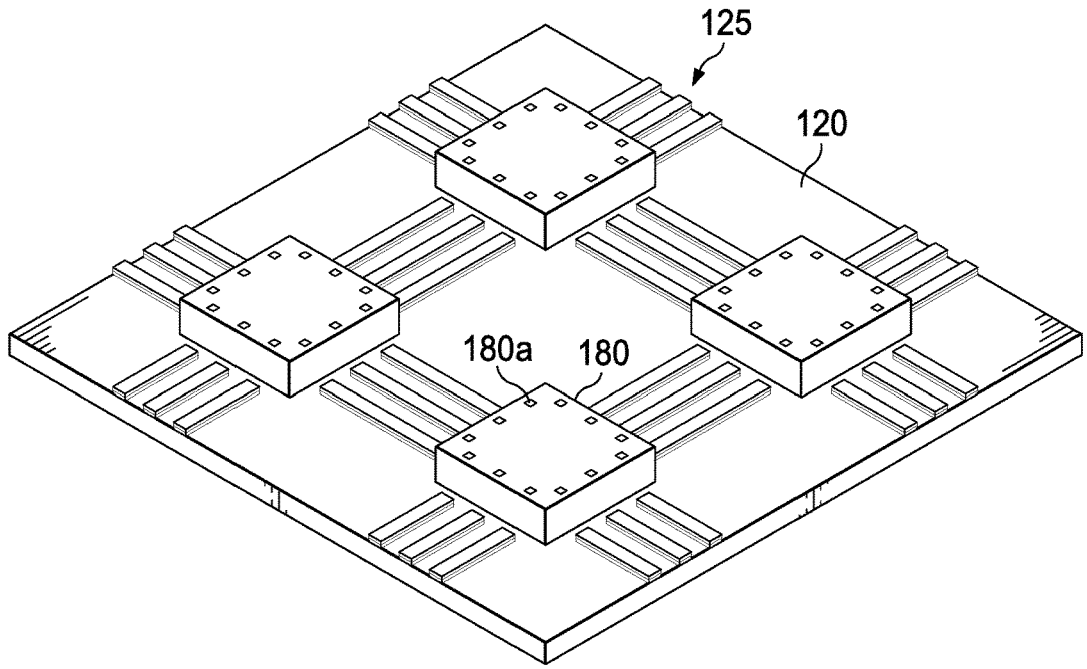
Figure 1E:
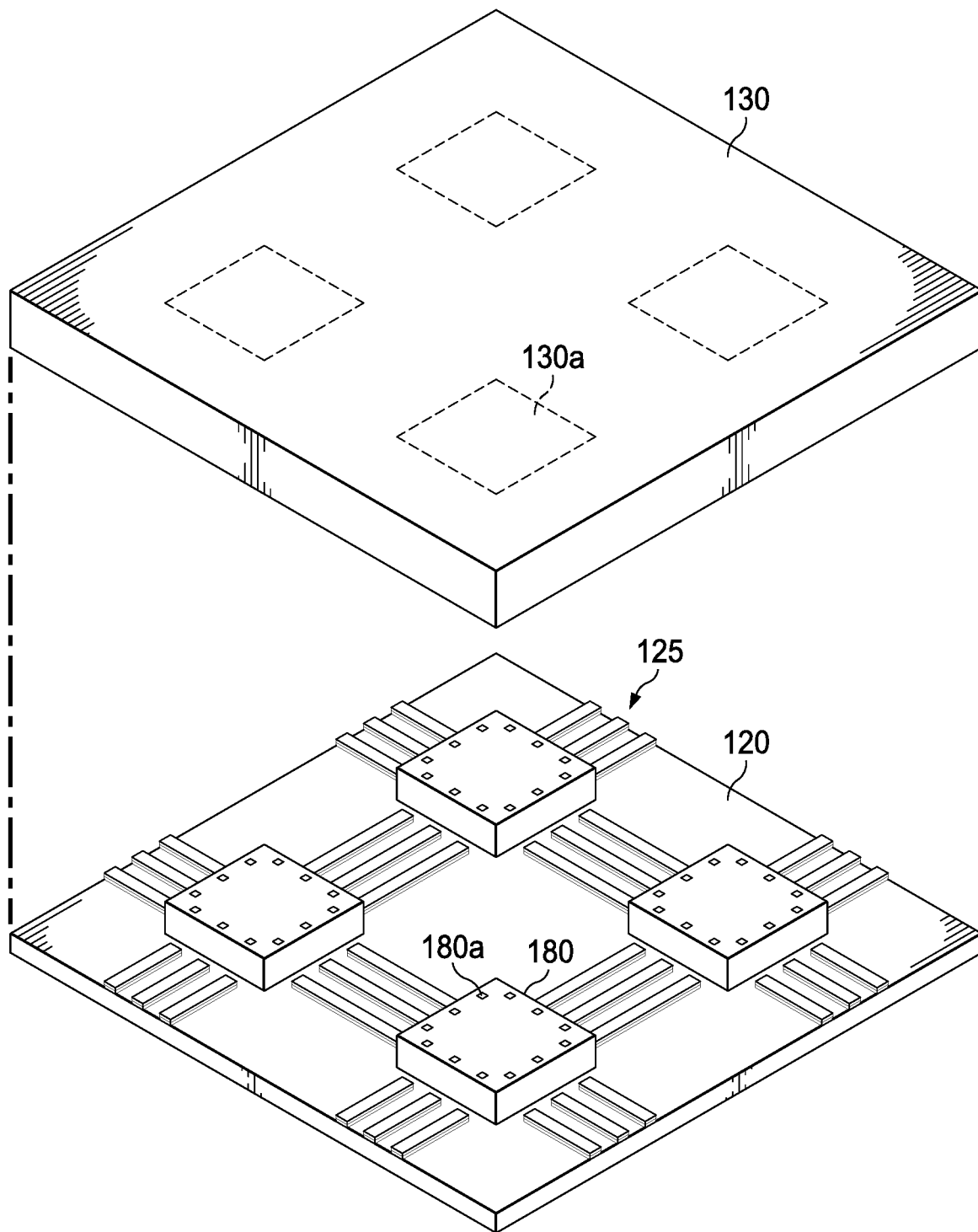
Figure 1F:
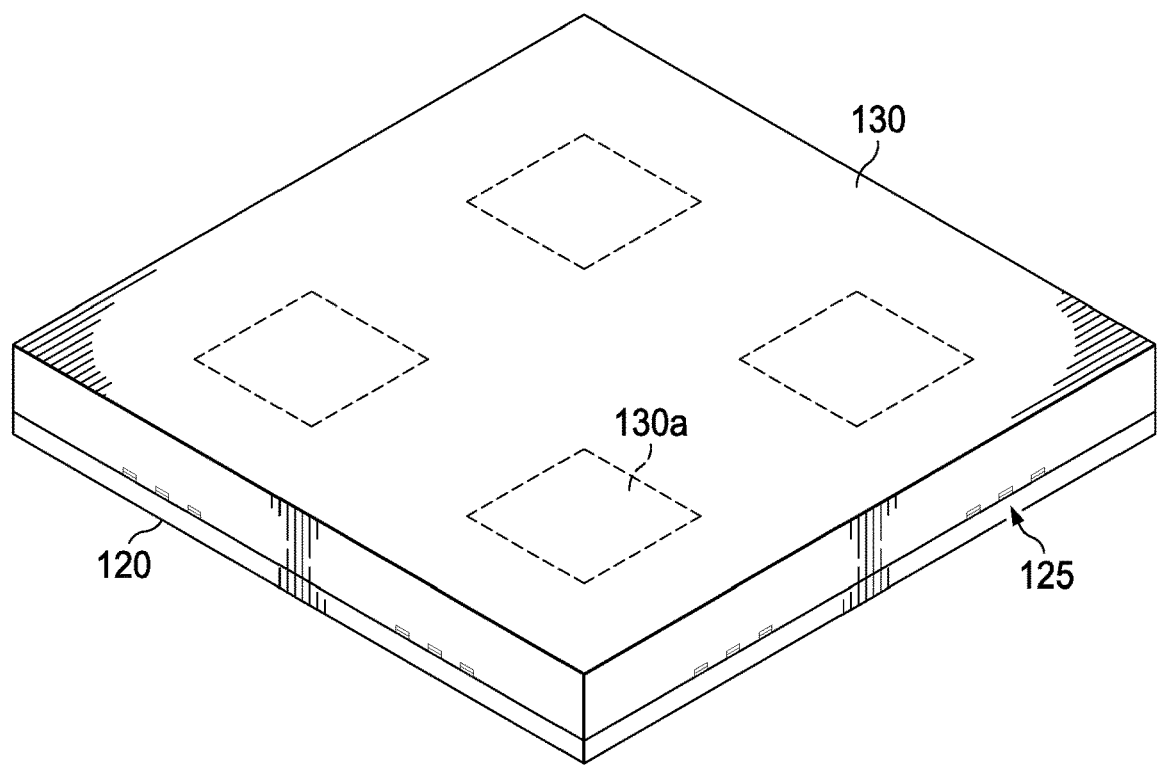
Figure 1G:
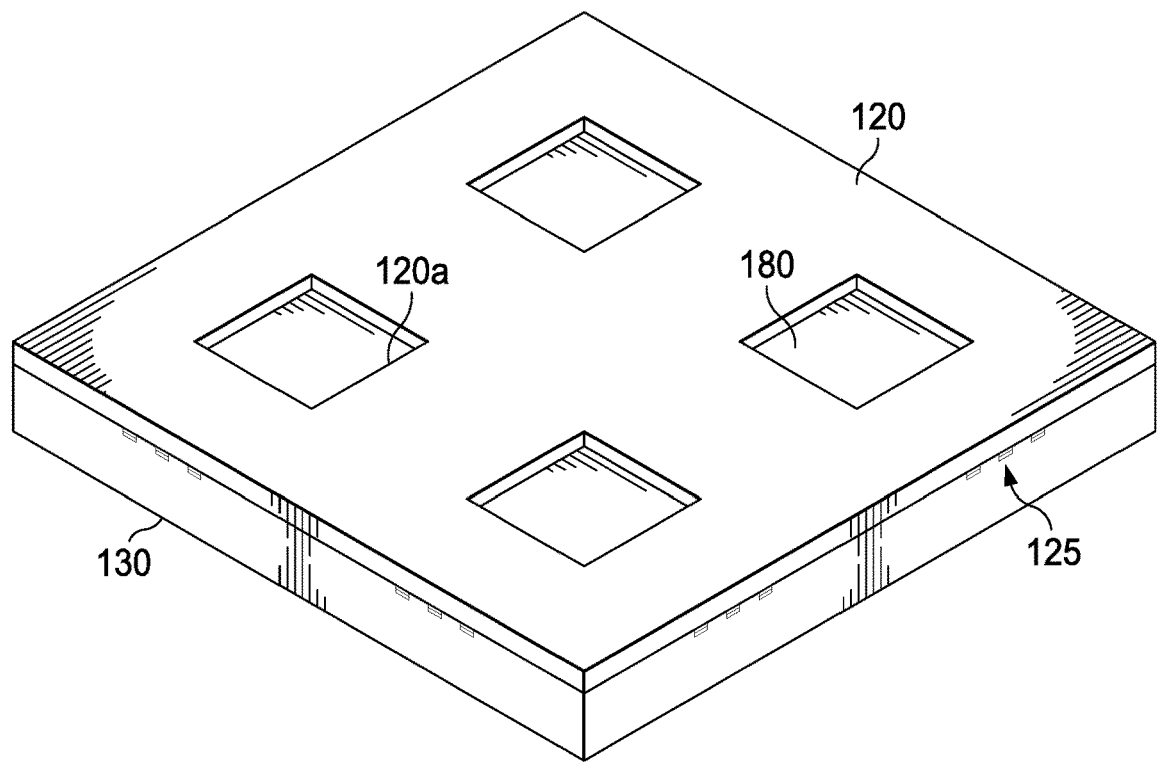

FIG. 1D shows semiconductor die 180 sitting top (active) side up with the back side down on the outer ring 120a1 (not shown) within the through-hole apertures 120a of an example metal substrate 120. Bond pads 180a are shown on the active top side of the semiconductor die 180. FIG. 1E shows the dielectric cover 130 just before placing it on the metal substrate 120 over the semiconductor die 180. FIG. 1F shows the dielectric cover 130 after being placing on the metal substrate 120 over the semiconductor die 180 looking down on the dielectric cover 130. FIG. 1G is the view in FIG. 1F inverted to look down at the bottom of the metal substrate 120 that reveals the portion of the apertures 120a not occupied by the semiconductor die 180.

Figure 1H:
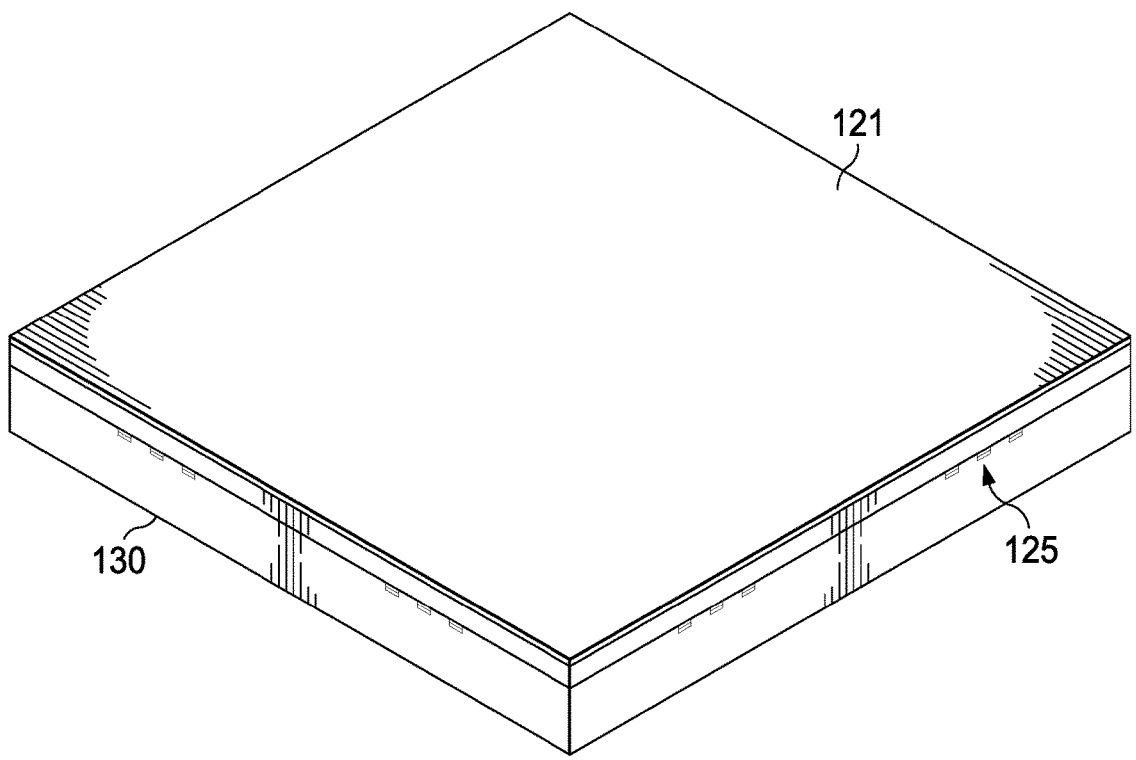

FIG. 1H show a back side view of the stack comprising the dielectric cover 130 on the metal substrate 120 over the semiconductor die 180 following electroplating to deposit an electroplated single metal layer, such as copper, to fill a volume between the BSM layer on the semiconductor die 180 and the walls of the metal substrate 120 bounding the apertures to provide a die attachment. The time for the electroplating process can be calculated by dividing the desired thickness by the deposition rate. The metal die attach layer 121 thickness is designed to fill the apertures, such as being 10 to 250 µm thick, for example 20 to 100 µm thick. FIG. 1H shows the aperture portion not occupied by the semiconductor die 180 (under the die) now filled with an electroplated metal die attach layer 121 that is deposited as a sheet on the entire bottom side of the metal substrate 120. Although the metal die attach layer 121 is shown being planar, there is generally a slight depression when over the respective through-hole apertures 120a.

The metal die attach layer 121 being an electroplated metal layer is distinctive as compared to other layers of the same metal material deposited by other methods, such as sputtered metal layers. Electrodeposited layers are known to fill regions that are not line of sight, unlike sputtered layers. Electrodeposited layers are also known to have a unique microstructure that includes an initially deposited Nernst diffusion layer that has a density and microstructure distinct from that of the bulk portion of the electrodeposited layer.

Figure 1I:
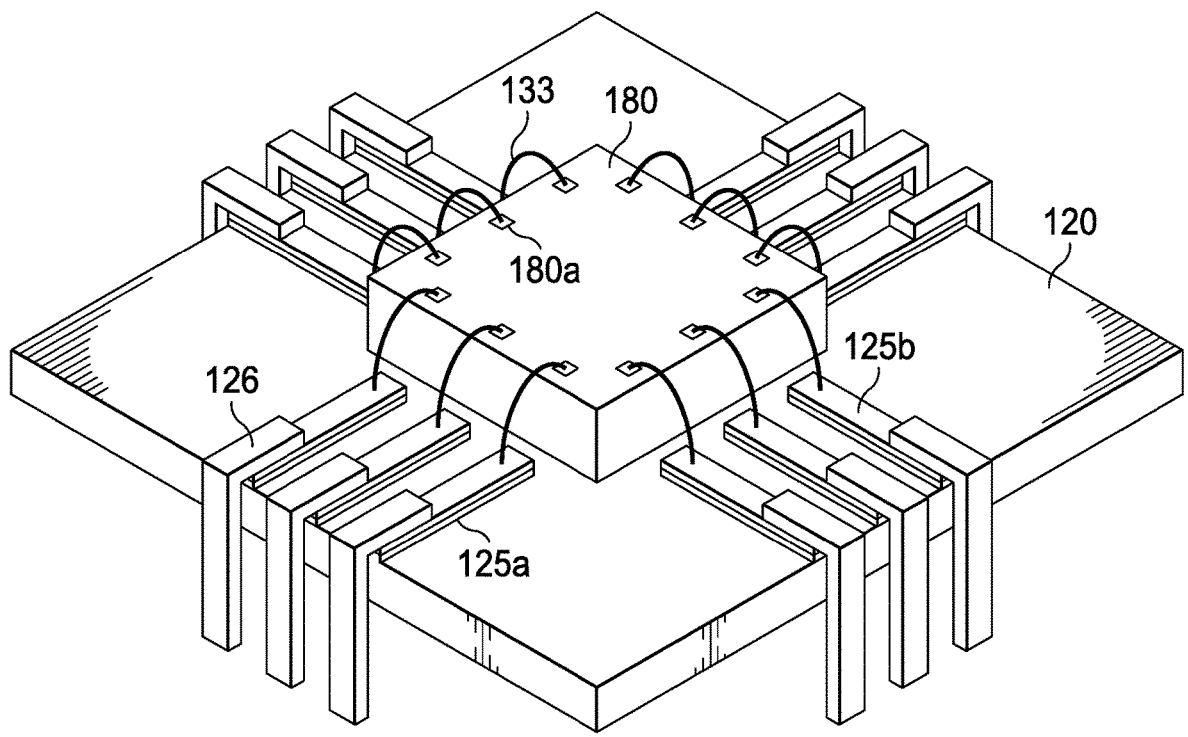

FIG. 1I shows a single packaged semiconductor device precursor after removing the stack from the plating solution, removing the dielectric cover 130, singulating the metal substrate 120 to form a plurality of packaged semiconductor device precursors including a first packaged semiconductor device precursor, and then adding leads 126. The leads 126 comprise strips of metal (e.g., the same metal as for lead frames) such as copper, copper alloy or tin coated leads that can be acquired commercially or generated in-house. For example, a metal sheet can be cut into strips of metal.

Figure 1J:
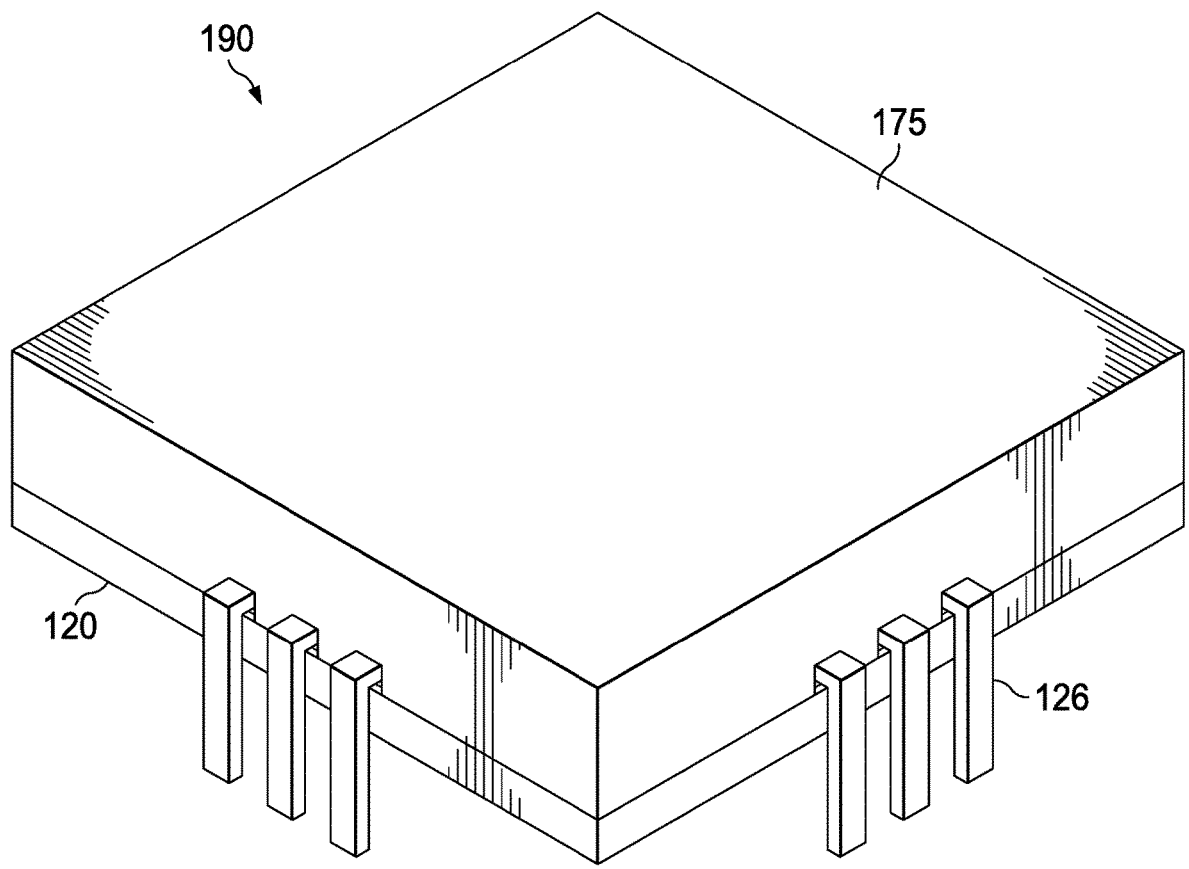

The leads 126 contact the metal layer 125b on the plurality of raised traces 125, have at least one bend, and include a distal portion that extends beyond the metal substrate 120. The leads 126 are generally soldered to the metal layer 125b but can also be attached via welding or an electrically conductive adhesive material. The bond wires 133 shown are added before singulation and are between the plurality of raised traces 125 and bond pads 180a on the semiconductor die 180. FIG. 1J shows a single packaged semiconductor device 190 after molding to form a mold compound 175 for encapsulation to complete the packaged semiconductor device. A Sn (tin) layer can optionally be added to the leads 126.

Figure 2:
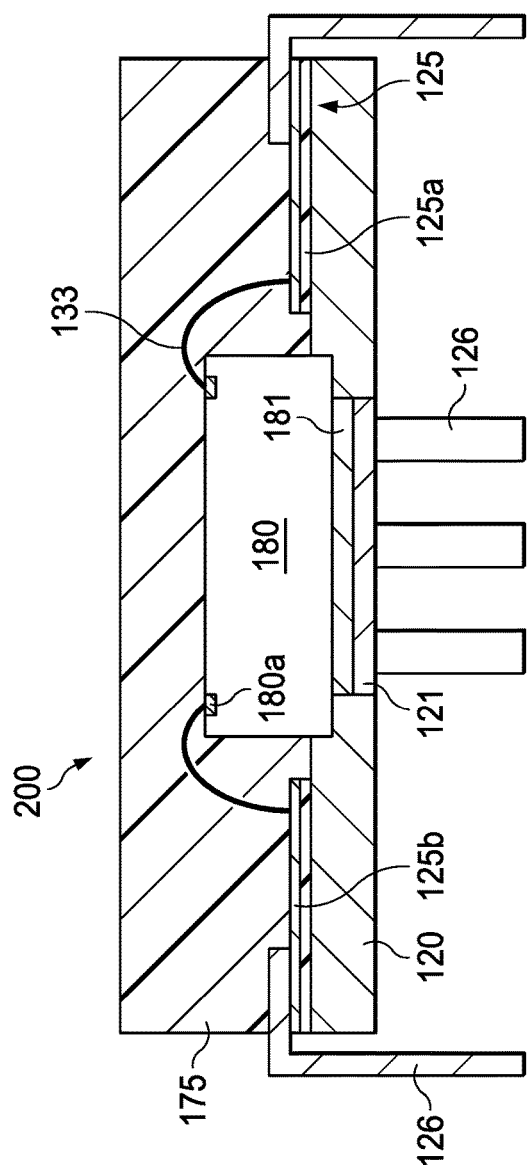
FIG. 2 is a cross sectional view of an example packaged semiconductor device having a semiconductor die with a BSM layer directly attached onto a metal substrate by an electroplated metal die attach layer, having leads with a 90 degree bend, according to an example aspect.
Figure 3:
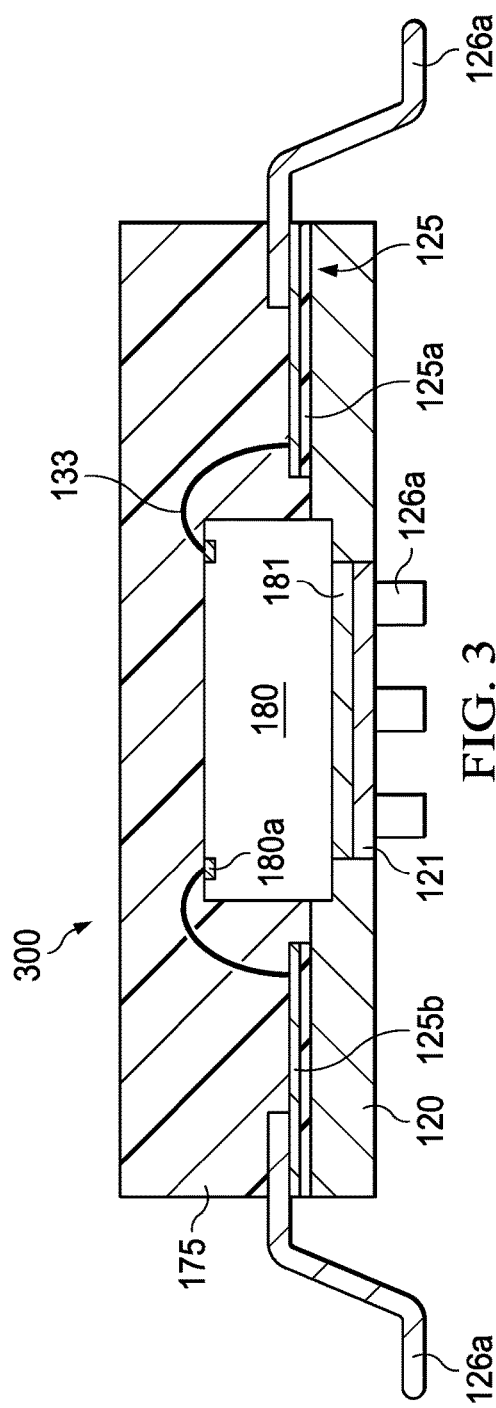
FIG. 3 is a cross sectional view of an example packaged semiconductor device having a semiconductor die with a BSM layer directly attached onto a metal substrate by an electroplated metal die attach layer, having gull wing leads as an example lead bend that is not a 90 degree bend, to an example aspect.

FIG. 2 is a cross sectional view of an example packaged semiconductor device 200 having a semiconductor die 180 with a BSM layer 181 directly attached onto a metal substrate 120 by an electroplated metal die attach layer 121, having leads 126 with a 90 degree bend, according to an example aspect. As noted above, the metal substrate 120 can comprise copper, such as a copper alloy, Ni, Co, Sn, or their alloys. The metal substrate 120 is generally about 0.1 mm (3.94 mils) to 0.3 mm (11.81 mils) thick. Moreover, as noted above, the metal die attach layer 121 is generally 10 to 250 µm thick, such as 20 to 100 µm thick. FIG. 3 is a cross sectional view of an example packaged semiconductor device 300 having a semiconductor die 180 with a BSM layer 181 directly attached onto a metal substrate by an electroplated metal die attach layer 121, having gull wing leads 126a as an example of a lead bend that is not a 90 degree bend, to an example aspect.

Advantages of disclosed aspects include the ability to perform die attachment at room temperature, high thermal dissipation from the semiconductor die to the metal substrate, and strong mechanical die support due to the high ductility of the electroplated metal die attach layers, such as when comprising copper. Moreover, a lower cost die attach solution is provided as compared to conventional epoxy filled with silver.

Disclosed embodiments can be integrated into a variety of assembly flows to form a variety of different packaged semiconductor integrated circuit (IC) devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many other embodiments and variations of embodiments are possible within the scope of the claimed invention, and further additions, deletions, substitutions and modifications may be made to the described embodiments without departing from the scope of this Disclosure.

The invention claimed is:

1. A packaged semiconductor device, comprising:
a metal substrate having a center aperture with a plurality of raised traces around the center aperture comprising a metal layer on a dielectric base layer;
a semiconductor die that has a back side metal (BSM) layer mounted top side up on a top portion of the aperture;
a single metal layer directly between the BSM layer and walls of the metal substrate bounding the center aperture to provide a die attachment that fills a bottom portion of the aperture;
leads having at least one bend that contact the metal layer on the plurality of traces and include a distal portion that extends beyond the metal substrate;
bond wires between the plurality of traces and bond pads on the semiconductor die, and
a mold compound providing encapsulation.

2. The packaged semiconductor device of claim 1, wherein the dielectric base layer comprises a polyimide.

3. The packaged semiconductor device of claim 1, wherein the BSM layer, the metal substrate, and the single metal layer all comprise copper.

4. The packaged semiconductor device of claim 1, wherein the single metal layer is 20 to 100 m thick.

5. The packaged semiconductor device of claim 1, wherein the metal substrate is 0.1 mm to 0.3 mm thick.

6. The packaged semiconductor device of claim 1, wherein the single metal layer is an electroplated metal layer.

7. A packaged semiconductor device, comprising:
a copper comprising substrate having a center aperture with a plurality of raised traces around the center aperture comprising a metal layer on a dielectric base layer;
a semiconductor die that has a back side metal (BSM) layer mounted top side up on a top portion of the aperture;
a single copper layer directly between the BSM layer and walls of the copper comprising substrate bounding the center aperture to provide a die attachment that fills a bottom portion of the aperture;
leads having at least one bend that contact the metal layer on the plurality of traces and include an distal portion that extends beyond the copper comprising substrate;
bond wires between the plurality of traces and bond pads on the semiconductor die, and
a mold compound providing encapsulation.

8. The packaged semiconductor device of claim 7, wherein the BSM layer comprises copper.

9. The packaged semiconductor device of claim 7, wherein the single copper layer is 20 to 100 µm thick.

10. A method of making a packaged semiconductor device, comprising:
providing a metal substrate having a center aperture with a plurality of raised traces around the center aperture comprising a metal layer on a dielectric base layer;
mounting a semiconductor die that has a back side metal (BSM) layer top side up on a top portion of the aperture;
forming a single metal layer directly between the BSM layer and walls of the metal substrate bounding the center aperture to provide a die attachment that fills a bottom portion of the aperture;
forming leads having at least one bend that contact the metal layer on the plurality of traces and include a distal portion that extends beyond the metal substrate;
attaching bond wires between the plurality of traces and bond pads on the semiconductor die, and
covering the semiconductor device with a mold compound.

11. The method of claim 10, wherein the dielectric base layer comprises a polyimide.

12. The method claim 10, wherein the BSM layer, the metal substrate, and the single metal layer all comprise copper.

13. The method of claim 10, wherein the single metal layer is 20 to 100 µm thick.

14. The method of claim 1, wherein the metal substrate is 0.1 mm to 03 mm thick.

15. The method of claim 10, wherein the single metal layer is an electroplated metal layer.

16. A method of making a packaged semiconductor device, comprising:
providing a copper comprising substrate having a center aperture with a plurality of raised traces around the center aperture comprising a metal layer on a dielectric base layer;
mounting a semiconductor die that has a back side metal (BSM) layer top side up on a top portion of the aperture;
forming a single copper layer directly between the BSM layer and walls of the copper comprising substrate bounding the center aperture to provide a die attachment that fills a bottom portion of the aperture;
forming leads having at least one bend that contact the metal layer on the plurality of traces and include an distal portion that extends beyond the copper comprising substrate;
attaching bond wires between the plurality of traces and bond pads on the semiconductor die, and
covering the semiconductor device with a mold compound.

17. The method of claim 16, wherein the BSM layer comprises copper.

18. The method of claim 17, wherein the single copper layer is 20 to 100 µm thick.

* * * * *